(12) United States Patent
Hamlin

(10) Patent No.: US 7,965,504 B2
(45) Date of Patent: Jun. 21, 2011

(54) EMBEDDED COMPUTER CHASSIS WITH REDUNDANT FAN TRAYS

(75) Inventor: Gregg R. Hamlin, Acton, MA (US)

(73) Assignee: Emerson Network Power—Embedded Computing, Inc., Madison, WI (US)

( * ) Notice: Subject to any disclaimer, the term of this patent is extended or adjusted under 35 U.S.C. 154(b) by 553 days.

(21) Appl. No.: 11/442,021

(22) Filed: May 25, 2006

(65) Prior Publication Data

US 2007/0274039 A1 Nov. 29, 2007

(51) Int. Cl.
*H05K 7/20* (2006.01)
*F28F 7/00* (2006.01)
*H05K 5/00* (2006.01)

(52) U.S. Cl. ............... 361/695; 361/679.5; 361/679.49; 361/727; 165/80.2; 454/184

(58) Field of Classification Search .......... 361/724, 361/679.48–679.51, 688–697, 701, 703; 454/184; 312/236; 62/259.2; 165/80.2–80.3
See application file for complete search history.

(56) References Cited

U.S. PATENT DOCUMENTS

| | | | | |
|---|---|---|---|---|
| 4,672,509 | A * | 6/1987 | Speraw ........................ | 361/687 |
| 6,604,916 | B2 * | 8/2003 | Lu et al. ....................... | 417/360 |
| 6,813,152 | B2 | 11/2004 | Perazzo | |
| 6,819,567 | B2 * | 11/2004 | Baker et al. .................. | 361/724 |
| 7,050,301 | B2 * | 5/2006 | Wong et al. .................. | 361/695 |
| 7,126,820 | B2 * | 10/2006 | Wei ............................... | 361/695 |
| 7,178,547 | B2 * | 2/2007 | Mackal ........................ | 137/68.3 |
| 7,184,267 | B2 * | 2/2007 | Patel ............................ | 361/692 |
| 7,280,356 | B2 * | 10/2007 | Pfahnl et al. ................. | 361/695 |
| 7,362,565 | B2 * | 4/2008 | Imblum ........................ | 361/685 |
| 7,813,121 | B2 * | 10/2010 | Bisson et al. ............. | 361/679.51 |
| 2002/0094282 | A1 | 7/2002 | Bendikas et al. | |
| 2003/0214785 | A1 | 11/2003 | Perazzo | |
| 2003/0223199 | A1 * | 12/2003 | Smith et al. ................. | 361/727 |
| 2004/0130868 | A1 * | 7/2004 | Schwartz et al. ............. | 361/687 |
| 2005/0276017 | A1 * | 12/2005 | Aziz et al. .................... | 361/695 |
| 2006/0067069 | A1 | 3/2006 | Heard et al. | |
| 2006/0256522 | A1 * | 11/2006 | Wei et al. ..................... | 361/695 |
| 2007/0207720 | A1 * | 9/2007 | Henry et al. ................. | 454/184 |
| 2008/0225479 | A1 * | 9/2008 | Zieman et al. ............... | 361/694 |

OTHER PUBLICATIONS

Notification of First Office Action for Chinese Patent Appln. No. 200780024840X (English Translation).

* cited by examiner

*Primary Examiner* — Zachary M Pape
(74) *Attorney, Agent, or Firm* — Harness, Dickey & Pierce, P.L.C.

(57) ABSTRACT

An embedded computer chassis may include a midplane having a first side and second side substantially opposite each other, where the midplane is suitably adapted to receive at least one computer card in each of the first side and the second side. Embedded computer chassis may further include a cooling region suitably adapted to cool the at least one computer card, where at least a portion of the cooling region is suitably adapted to receive a first fan tray and a second fan tray, where the first fan tray is suitably adapted to couple to the first side of the midplane, and where the second fan tray is suitably adapted to couple to the second side of the midplane. The first fan tray and the second fan tray are substantially redundant for removing the heat generated by the at least one computer card.

30 Claims, 1 Drawing Sheet

EMBEDDED COMPUTER CHASSIS WITH REDUNDANT FAN TRAYS

BACKGROUND OF INVENTION

Embedded computer chassis systems generally include numerous rack-mounted computer cards connected to a backplane or a midplane. The computer cards may include payload cards and switch cards that communicate using a bus or switched fabric topology over the backplane. The payload cards and switch cards may be chosen so as to provide the computer chassis with the functionality and features desired by a user.

Each embedded computer chassis generally includes cooling fan trays mounted in the chassis to cool the computer cards. Periodically, these cooling fan trays need to be removed for maintenance and replacement without interrupting the operation of the embedded computer chassis.

For each region in an embedded computer chassis, prior methods of cooling use monolithic fan trays that contain any number of cooling fans. While there may be redundancy in the number of fans in the monolithic fan tray, there is no redundancy for the fan tray itself. If the monolithic fan tray is removed to service a disabled fan, the entire chassis may have to be shut down because without the fan tray, the computer cards will quickly overheat. A shutdown of a chassis is unacceptable from a quality of service standpoint.

The prior art is deficient in providing redundancy in the number of fan trays in a given cooling region in an embedded computer chassis. Accordingly, there is a significant need for an apparatus and method that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

The terms "a" or "an", as used herein, are defined as one, or more than one. The term "plurality," as used herein, is defined as two, or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically.

A detailed description of an exemplary application is provided as a specific enabling disclosure that may be generalized to any application of the disclosed system, device and method for a computer cooling system in accordance with various embodiments of the present invention.

Figure 1:
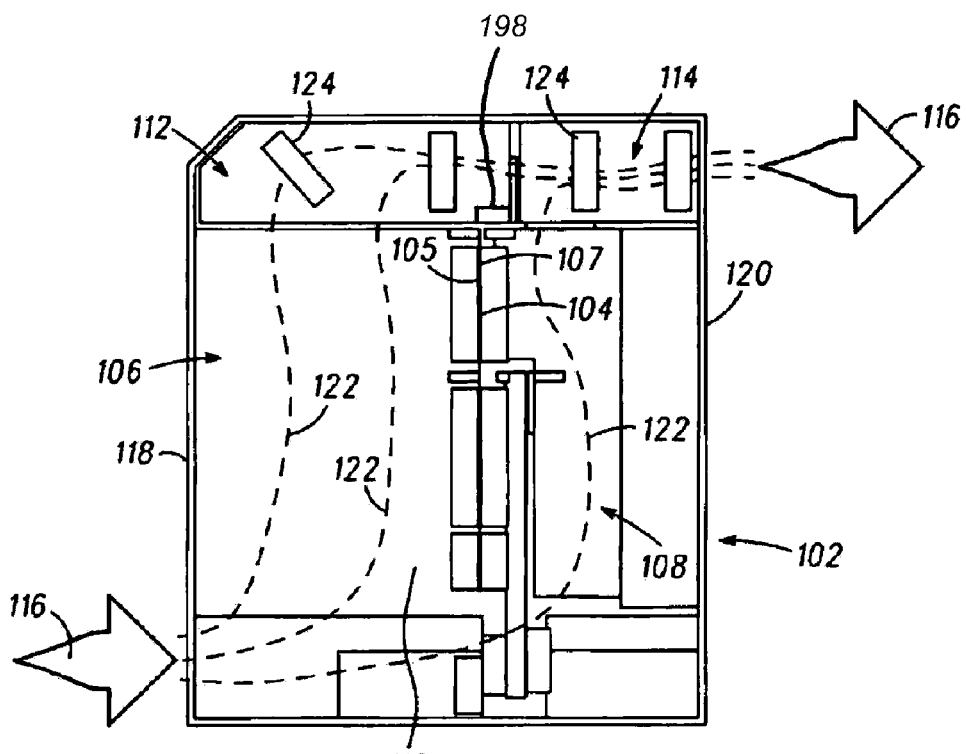
FIG. 1 representatively illustrates a side elevation view of an embedded computer chassis in accordance with an exemplary embodiment of the present invention.

FIG. 1 representatively illustrates a side elevation view of an embedded computer chassis 102 in accordance with an exemplary embodiment of the present invention. As shown in FIG. 1, embedded computer chassis 102 can be defined by a plurality of outer surfaces including a front side 118 and a rear side 120. Embedded computer chassis 102 can include a portion having any number of slots suitably adapted for receiving one or more computer cards. For example, a portion can be suitably adapted for receiving at least one of front card 106 or rear card 108. As an example, front card 106 can be coupled to a first side 105 of a midplane 104, and rear card 108 can be coupled to rear side 107 of midplane 104.

Midplane 104 may include hardware and software necessary to implement a data network using a parallel multi-drop topology, switched fabric topology, and the like. Midplane 104 is disposed substantially vertical within embedded computer chassis 102 and substantially parallel to front side 118 and rear side 120. In another embodiment, midplane 104 may be disposed horizontally.

As an example of an embodiment, a front card 106 may be a payload card, switch card, and the like. Rear card 108 may be a rear transition card to couple embedded computer chassis 102 to other chassis, networks devices, and the like. Each of front card 106 and rear card 108 can include a printed circuit board (PCB) having any number of electronic devices located thereon, for example, and without limitation, processors, memory, storage devices, I/O elements, and the like. In an embodiment, front card 106 and rear card 108 are substantially vertically disposed in conjunction with the orientation of midplane 104. In another embodiment, front card 106 and/or rear card 108 may be disposed substantially horizontally.

Embedded computer chassis 102 may be adapted for use in any application requiring modular, embedded computing resources, for example and without limitation, telecommunications, industrial control, system control and data acquisition (SCADA), and the like. In the exemplary embodiment, embedded computer chassis 102 can be a 1U, 3U, 6U, 9U chassis, and the like. Embedded computer chassis 102 may be coupled together and "stacked" to form a distributed computing system coupled to share resources from each chassis.

As is known in the art, "U" and multiples of "U" can refer to both the width of a card and the height of the embedded computer chassis 102. In an embodiment, "U" can measure approximately 1.75 inches. As an example of an embodiment, a card portion can be coupled to accommodate 6U form factor front card 106 and rear card 108. Any size chassis or cards are within the scope of the invention. The "U" terminology is not limiting of the invention. As such, the invention is not limited to "U" as a form factor reference. Other form factor reference notations and increments are within the scope of the invention.

In an embodiment, embedded computer chassis 102 may include midplane 104, front card 106 and rear card 108 suitably adapted to operate a parallel multi-drop network, for example, a VERSAmodule Eurocard (VMEbus) network using any of the VMEbus protocols known in the art. VMEbus is defined in the ANSI/VITA 1-1994 and ANSI/VITA 1.1-1997 standards, promulgated by the VMEbus International Trade Association (VITA), P.O. Box 19658, Fountain Hills, Ariz., 85269 (where ANSI stands for American National Standards Institute). In an embodiment of the invention, VMEbus based protocols can include, but are not limited to, Single Cycle Transfer protocol (SCT), Block Transfer protocol (BLT), Multiplexed Block Transfer protocol (MBLT), Two Edge VMEbus protocol (2eVME) and Two Edge Source Synchronous Transfer protocol (2eSST). These VMEbus protocols are known in the art.

In another embodiment, embedded computer chassis 102 may include midplane 104, front card 106 and rear card 108 suitably adapted to operate a switched fabric. Switched fabric may use switch card as a central switching hub with any number of payload cards coupled to switch card. Switched fabric can be based on a point-to-point, switched input/output (I/O) fabric, whereby cascaded switch devices interconnect end node devices. In an embodiment, switched fabric can be configured as a star topology, mesh topology, and the like as known in the art for communicatively coupling switched fabrics. Switched fabric can include both card-to-card (for example computer systems that support I/O card add-in slots) and chassis-to-chassis environments (for example interconnecting computers, external storage systems, external Local Area Network (LAN) and Wide Area Network (WAN) access devices in a data-center environment). Switched fabric can be implemented by using one or more of a plurality of switched fabric network standards, for example and without limitation, InfiniBand™, Serial RapidIO™, FibreChannel™, Ethernet™, PCI Express™, AdvancedTCA™, Hypertransport™, Gigabit Ethernet, and the like. Switched fabric is not limited to the use of these switched fabric network standards and the use of any switched fabric network standard is within the scope of the invention.

In another embodiment, embedded computer chassis 102 may include midplane 104, front card 106 and rear card 108 suitably adapted to comply with the Advanced Telecom and Computing Architecture (ATCA™) standard as defined in the PICMG 3.0 AdvancedTCA specification (and subsequent revisions). In yet another embodiment, embedded computer chassis 102 may include midplane 104, front card 106 and rear card 108 suitably adapted to comply with CompactPCI® standard. In still another embodiment, embedded computer chassis 102 can include midplane 104, front card 106 and rear card 108 suitably adapted to may comply with MicroTCA standard as defined in PICMG® MicroTCA Draft 0.6—Micro Telecom Compute Architecture Base Specification (and subsequent revisions).

In still yet another embodiment, embedded computer chassis 102 may include midplane 104, front card 106 and rear card 108 suitably adapted to operate a VXS network where midplane 104 conforms to the VERSAmodule Eurocard (VMEbus) switched serial standard backplane (VXS) as set forth in VITA 41 promulgated by VMEbus International Trade Association (VITA), P.O. Box 19658, Fountain Hills, Ariz., 85269. VXS network includes a switched fabric and a VMEbus network, both located on midplane 104. In other words, a VXS network includes a switched fabric coincident, and operating concurrently with a VMEbus network on midplane 104. The embodiment of the invention is not limited to a computer system complying with any of these standards, and computer systems complying with other standards are within the scope of the invention.

When in operation, computing cards, among other devices, may generate heat that must be removed from embedded computer chassis 102. In an embodiment, embedded computer chassis may comprise any number of surfaces to define a cooling region 110. Cooling region 110 may include an air plenum region and an interspace region, where the interspace region is suitably adapted to receive a first fan tray 112 and a second fan tray 114. The first fan tray 112 may be suitably adapted to couple to the first side 105 of the midplane 104, and the second fan tray 114 may be suitably adapted to couple to the second side 107 of the midplane 104, substantially opposite each other. In an embodiment, the first fan tray 112 and the second fan tray 114 are substantially redundant for removing the heat generated by at least one computer card. Optionally, first fan tray 112 and/or second fan tray 114 may include temperature sensors and other hardware and software modules to detect and react to temperature changes in embedded computer chassis 102.

Cooling region may extend the height of embedded computer chassis 102 or a portion thereof. The specific size and configuration of cooling region 110 can be tailored by one skilled in the art to fit a specific application and be within the scope of the invention. Cooling region 110 may include a region around one or more of the computer cards, for example front card 106 and rear card 108. Cooling region 110 may be suitably adapted to cool the at least one computer card, for example at least one of front card 106 and rear card 108.

In an embodiment, a surface of embedded computer chassis 102, for example front side 118 may include one or more orifices to allow cooling air 116 to be drawn into embedded computer chassis 102 in a direction substantially perpendicular to front side 118, for example into a plenum region. Air plenum region may include an entry screen/filter and a cavity where cooling air 116 enters embedded computer chassis 102. Cooling air 116 may function to cool heat-generating electronics associated with front card 106, rear card 108, midplane 104, and the like. Cooling air 116 may follow a substantially defined path 122 through embedded computer chassis 102 and cooling region 110.

In an embodiment, embedded computer chassis 102 can include a first fan tray 112 and a second fan tray 114 suitably configured to slidably insert into an interspace region of cooling region 110. First fan tray 112 may couple to first side 105 of midplane 104, and second fan tray 114 may couple to second side 107 of midplane 104 substantially opposite first fan tray 112. In an embodiment, first fan tray 112 and second fan tray 114 may draw power from midplane 104 or from another dedicated circuit in embedded computer chassis 102. In an embodiment, each of first fan tray 112 and second fan tray 114 may be hot-swappable in embedded computer chassis 102 so that slidably inserting or removing first fan tray 112 and/or second fan tray 114 does not disrupt the operation of embedded computer chassis 102.

In an embodiment, each of first fan tray 112 and second fan tray 114 may include any number of fans 124, which can include, for example and without limitation, centrifugal fans, axial fans, blowers, and the like. Fans 124 may be suitably configured in any combination of "push" or "pull" patterns and disposed at any appropriate angle in the fan tray. Fans 124 may either "push" cooling air 116 over one or more computer cards or "pull" cooling air 116 over one or more computer cards, or any combination thereof. In pushing or pulling cooling air 116 over computer cards, cooling air 116 may flow over one or both sides of computer cards. As an example of an embodiment, each of first fan tray 112 and second fan tray 114 may include one or more axial fans. The number and operating point of fans 124 can be chosen to fit a particular application and is well within the abilities of one of ordinary skill in the art.

In an embodiment, each of first fan tray 112 and second fan tray 114 may be suitably adapted to draw cooling air 116 over front card 106 and rear card 108 in a direction substantially parallel to midplane 104. Once cooling air 116 reaches one or both of first fan tray 112 and second fan tray 114, cooling air 116 may be turned approximately ninety degrees toward rear side 120 as shown by defined path 122. Cooling air 116 may then be exhausted from orifices on rear side 120 of embedded computer chassis 102. In another embodiment, cooling air 116 may be drawn in from the rear side 120 and exhausted from the front side 118. Cooling air 116 may be drawn in and/or exhausted from any surface of embedded computer chassis 102 and be within the scope of the invention.

In the embodiment shown, first fan tray 112 and second fan tray 114 are shown above computer cards, while the air plenum region is below the computer cards. This is not limiting of the invention, as the fan trays and air plenum region may be disposed in any configuration in or around embedded computer chassis 102 and be within the scope of the invention.

In an embodiment, one or both of first fan tray 112 and second fan tray 114 may include a controller card 198. In an embodiment, controller card 198 plugs into midplane 104 and operates to control the fans in each of the fan tray cards. For example, and without limitation, controller card 198 may be suitably adapted to power up both first fan tray 112 and second fan tray 114, monitor the fans 124 and increase/decrease them to a selected speed based on feedback from one or more temperature sensors. In an embodiment, one controller card 198 may be suitably adapted to operate both first fan tray 112 and second fan tray 114. Controller card may also operate to report fan management data to a maintenance bus, for example an Intelligent Platform Management Bus (IPMB). Fan management data may include, but is not limited to, temperature, voltage, amperage, bus traffic, status indications, and the like.

In an embodiment, first fan tray 112 and second fan tray 114 are substantially redundant in cooling one or more computer cards in a given cooling region 110 of embedded computer chassis 102. For example, if one of first fan tray 112 or second fan tray 114 are removed, the remaining fan tray is substantially capable of removing the necessary heat from cooling region 110 to allow one or more computer cards in cooling region 110 to remain functional.

Figure 2:
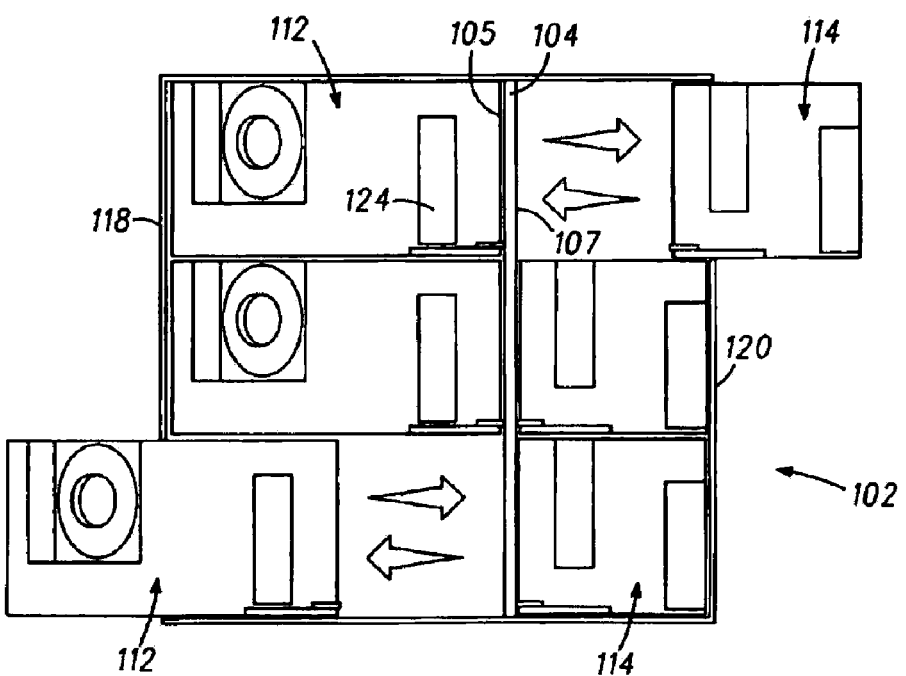
FIG. 2 representatively illustrates a top plan cut-away view of an embedded computer chassis in accordance with an exemplary embodiment of the present invention.

FIG. 2 representatively illustrates a top plan cut-away view of an embedded computer chassis 102 in accordance with an exemplary embodiment of the present invention. The embedded computer chassis 102 shown in FIG. 2 includes three distinct cooling regions. Each cooling region is serviced by its own set of first fan tray 112 and second fan tray 114, which are substantially redundant for each cooling region.

For example, if the second fan tray 114 is removed for maintenance in the top cooling region (as depicted by the arrows), the corresponding first fan tray 112 is substantially able to remove the necessary heat from its cooling region to allow one or more computer cards in that cooling region to remain functional.

Analogously, if the first fan tray 112 is removed for maintenance in the front cooling region (as depicted by the arrows), the corresponding second fan tray 114 is substantially able to remove the necessary heat from its cooling region to allow one or more computer cards in that cooling region to remain functional. The invention is not limited to one, two, three, etc. cooling regions. An embedded computer chassis may have any number of cooling regions and be within the scope of the invention.

The above embodiments offer the advantage over the monolithic fan trays of the prior art by having a set of redundant, bifurcated fan trays for each cooling region in an embedded computer chassis. Particularly, redundant fan trays are provided that may couple to opposite sides of a midplane and may operate from a single controller card 198 provided by either fan tray. Further, cooling air may flow serially through each fan tray and the fan trays are redundant in providing cooling to a particular cooling region in an embedded computer chassis.

In the foregoing specification, the invention has been described with reference to specific exemplary embodiments. However, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

I claim:

1. An embedded computer chassis, comprising:
   a midplane having a first side and second side substantially opposite each other, wherein the midplane is suitably adapted to receive at least one computer card in each of the first side and the second side, the midplane dividing the chassis to define a first cooling region on the first side of the midplane and a second cooling region on the second side of the midplane;

wherein a selected one of the first and second cooling regions is suitably adapted to cool and substantially contain the at least one computer card, wherein at least a portion of the selected cooling region is suitably adapted to receive a first fan tray and the other of the first and second region is adapted to receive a second fan tray, wherein the first fan tray is suitably adapted to couple to the first side of the midplane, wherein the second fan tray is suitably adapted to couple to the second side of the midplane, and wherein the first fan tray and the second fan tray are substantially redundant for removing the heat generated by the at least one computer card.

2. The embedded computer chassis of claim 1, further comprising a controller card, wherein the controller card is suitably adapted to operate the first fan tray and the second fan tray.

3. The embedded computer chassis of claim 1, wherein cooling air enters from a front side of the embedded computer chassis and exhausts from a rear side of the embedded computer chassis.

4. The embedded computer chassis of claim 3, wherein the cooling air follows a defined path in at least one of the first and second cooling regions.

5. The embedded computer chassis of claim 4, wherein the defined path includes the cooling air passing through at least one of the first fan tray and the second fan tray.

6. The embedded computer chassis of claim 1, wherein at least one of the first fan tray and the second fan tray are hot-swappable.

7. The embedded computer chassis of claim 1, wherein the first fan tray and the second fan tray are each configured to independently remove the heat generated by the at least one computer card.

8. A method of cooling in an embedded computer chassis, comprising:

providing a midplane having a first side and second side substantially opposite each other, wherein the midplane is suitably adapted to receive at least one computer card in each of the first side and the second side, the midplane dividing the chassis into a first cooling region on the first side of the midplane and a second cooling region on the second side of the midplane; and wherein a selected one of the first and second cooling regions is suitably adapted to cool and to substantially contain the at least one computer card, wherein at least a portion of the first or second cooling regions is suitably adapted to receive a first fan tray and the other of the first or second cooling regions is suitably adapted to receive a second fan tray, wherein the first fan tray is suitably adapted to couple to the first side of the midplane, wherein the second fan tray is suitably adapted to couple to the second side of the midplane, and wherein the first fan tray and the second fan tray are substantially redundant for removing the heat generated by the at least one computer card.

9. The method of claim 8, further comprising providing a controller card, wherein the controller card is suitably adapted to operate the first fan tray and the second fan tray.

10. The method of claim 8, further comprising cooling air entering from a front side of the embedded computer chassis and exhausting from a rear side of the embedded computer chassis.

11. The method of claim 10, further comprising the cooling air following a defined path in at least one of the first and second cooling regions.

12. The method of claim 11, further comprising the cooling air passing through at least one of the first fan tray and the second fan tray.

13. The method of claim 8, wherein at least one of the first fan tray and the second fan tray are hot-swappable.

14. The method of claim 8, further comprising removing at least one of the first fan tray and the second fan tray, and wherein a one of the first fan tray and the second fan tray remaining continues to adequately cool the at least one computer card.

15. The method of claim 8, wherein the first fan tray and the second fan tray are each configured to independently remove the heat generated by the at least one computer card.

16. A cooling system for an embedded computer chassis, comprising:

a midplane dividing the chassis into a first cooling region on a first side and a second cooling region on a second side;

a first fan tray suitably adapted to couple to the first side of a midplane in the embedded computer chassis; and a second fan tray suitably adapted to couple to the second side of the midplane in the embedded computer chassis, wherein the first side is substantially opposite the second side, wherein the first fan tray and the second fan tray are suitably adapted to be disposed in at least a portion of a respective cooling region in the chassis, wherein at least one of the first or second cooling regions is suitably adapted to cool and to substantially contain the at least one computer card, and wherein first fan tray and the second fan tray are substantially redundant for removing heat generated by the at least one computer card.

17. The cooling system of claim 16, further comprising a controller card, wherein the controller card is suitably adapted to operate the first fan tray and the second fan tray.

18. The cooling system of claim 16, wherein cooling air enters from a front side of the embedded computer chassis and exhausts from a rear side of the embedded computer chassis.

19. The cooling system of claim 18, wherein the cooling air follows a defined path in at least one of the first and second cooling regions.

20. The cooling system of claim 19, wherein the defined path includes the cooling air passing through at least one of the first fan tray and the second fan tray.

21. The cooling system of claim 16, wherein at least one of the first fan tray and the second fan tray are hot-swappable.

22. The cooling system of claim 16, wherein if one of the first fan tray and the second fan tray are removed, a one of the first fan tray and the second fan tray remaining will continue to adequately cool the at least one computer card.

23. The embedded computer chassis of claim 16, wherein the first fan tray and the second fan tray are each configured to independently remove the heat generated by the at least one computer card.

24. An embedded computer chassis, comprising:

a midplane implementing a data network, wherein the midplane has a first side and second side substantially opposite each other, wherein the midplane is suitably adapted to receive and is in data communication with at least one computer card in each of the first side and the second side;

a first cooling region on the first side of the midplane and a second cooling region on the second side of the midplane, the midplane dividing the chassis into the first and second cooling regions which are suitably adapted to cool and to substantially contain the at least one computer card in each of the first side and the second side, wherein at least a portion of the cooling region is suitably adapted to receive a first fan tray and a second fan tray, wherein the first fan tray is suitably adapted to couple to the first side of the midplane, wherein the second fan tray is suitably adapted to couple to the second side of the midplane;

an air plenum region, wherein the first fan tray and the second fan tray are substantially redundant for removing the heat generated in the air plenum region, wherein the midplane and the at least one computer card in each of the first side and the second side are placed substantially in the air plenum region.

25. The embedded computer chassis of claim 24, further comprising a controller card disposed in at least one of the first and second fan tray, wherein the controller card is suitably adapted to operate the first fan tray and the second fan tray.

26. The embedded computer chassis of claim 24, wherein cooling air enters from a front side of the embedded computer chassis and exhausts from a rear side of the embedded computer chassis.

27. The embedded computer chassis of claim 26, wherein the cooling air follows a defined path in at least one of the first and second cooling regions.

28. The embedded computer chassis of claim 27, wherein the defined path includes the cooling air passing through at least one of the first fan tray and the second fan tray.

29. The embedded computer chassis of claim 24, wherein at least one of the first fan tray and the second fan tray are hot-swappable.

30. The embedded computer chassis of claim 24, wherein the first fan tray and the second fan tray are each configured to independently remove the heat generated by the at least one computer card.

* * * * *

UNITED STATES PATENT AND TRADEMARK OFFICE
CERTIFICATE OF CORRECTION

| | | |
|---|---|---|
| PATENT NO. | : 7,965,504 B2 | Page 1 of 1 |
| APPLICATION NO. | : 11/442021 | |
| DATED | : June 21, 2011 | |
| INVENTOR(S) | : Gregg R. Hamlin | |

It is certified that error appears in the above-identified patent and that said Letters Patent is hereby corrected as shown below:

IN THE CLAIMS:

<u>Column 9,</u>
Line 2, claim 24, after "and", delete "to".

Signed and Sealed this
Thirteenth Day of September, 2011

David J. Kappos
*Director of the United States Patent and Trademark Office*